United States Patent
Omori

(10) Patent No.: US 7,175,952 B2
(45) Date of Patent: Feb. 13, 2007

(54) METHOD OF GENERATING MASK DISTORTION DATA, EXPOSURE METHOD AND METHOD OF PRODUCING SEMICONDUCTOR DEVICE

(75) Inventor: Shinji Omori, Kanagawa (JP)

(73) Assignee: Sony Corporation, Tokyo (JP)

( * ) Notice: Subject to any disclaimer, the term of this patent is extended or adjusted under 35 U.S.C. 154(b) by 472 days.

(21) Appl. No.: 10/848,918

(22) Filed: May 19, 2004

(65) Prior Publication Data

US 2005/0014076 A1    Jan. 20, 2005

(30) Foreign Application Priority Data

May 29, 2003   (JP)   ............... P2003-153251

(51) Int. Cl.
*G03F 9/00* (2006.01)
*G03C 5/00* (2006.01)
(52) U.S. Cl. ............... 430/30; 430/5; 430/296; 430/942; 382/144; 716/19
(58) Field of Classification Search ............ 430/5, 430/22, 30, 296, 942; 716/19; 382/144
See application file for complete search history.

(56) References Cited

U.S. PATENT DOCUMENTS 6,040,095 A *   3/2000  Enichen et al. ............ 430/5
6,171,736 B1 *  1/2001  Hirayanagi ............... 430/22
2002/0098423 A1* 7/2002  Koba ...................... 430/5

\* cited by examiner

*Primary Examiner*—Christopher G. Young
(74) *Attorney, Agent, or Firm*—Sonnenschein Nath & Rosenthal LLP

(57) ABSTRACT

A method of generating mask distortion data capable of improving accuracy of distortion measurement, an exposure method using the same and a method of producing a semiconductor device, wherein a production mask is produced by a first thin film formed with a predetermined pattern, and a positional accuracy measurement mask is produced by forming second positional accuracy measurement marks at substantially same positions as those of the first positional accuracy measurement marks on a mask blanks having a second thin film, positions of the second positional accuracy measurement marks and third positional accuracy measurement marks of the positional accuracy measurement mask are measured, a correlation function of the both are calculated, positions of the first positional accuracy measurement marks of the production mask are measured, and mask distortion data on the first thin film of the production mask is generated by using the correlation function.

10 Claims, 15 Drawing Sheets

US 7,175,952 B2

METHOD OF GENERATING MASK DISTORTION DATA, EXPOSURE METHOD AND METHOD OF PRODUCING SEMICONDUCTOR DEVICE

RELATED APPLICATION DATA

The present application claims priority to Japanese Application(s) No(s). P2003-153251 filed May 29, 2003, which application(s) is/are incorporated herein by reference to the extent permitted by law.

BACKGROUND OF THE INVENTION

1. Field of the Invention

The present invention relates to a method of generating mask distortion data used in a lithography step in producing a semiconductor device, an exposure method using the same, and a method of producing a semiconductor device using the same.

2. Description of the Related Art

Masks having a common point are used in lithography using charged particles, such as an electron beam (EB) and an ion beam, under development as next generation lithography (NGL) which follows after present photolithography (wavelengths of 248 nm and 193 nm are dominant) used in mass production of a semiconductor device.

The common point is that, by deeply etching a substrate to be a mask from the back surface side to leave a thin film (membrane) having a thickness of 10 nm to 10 μm or so, mask blanks as a mask before being formed a pattern are formed and a pattern to be transferred are arranged to the obtained thin film.

Since such a mask includes a membrane region having low mechanical strength, not to mention a method of forming a pattern of high positional accuracy (IP: image placement), a technique of measuring distortion of a mask and correcting an IP error by using the information is important.

Proximity electron lithography (PEL) and electron projection lithography (EPL) are particularly dominant among NGL using an EB.

General explanations on an electronic optical system and mask of the two methods are described on the PEL in "Journal of Vacuum Science and Technology", B17, p. 2897 (1999) by T. Utsumi and on the EPL in "Japanese Journal of Applied Physics", 34, p. 6658 (1999) by H. C. Pfeiffer.

Among masks used in the above PEL and EPL, (1) those having a transfer pattern formed by an opening of a membrane are called stencil masks (for example, refer to "Japanese Journal of Applied Physics", 34, p. 6658 (1999) by H. C. Pfeiffer) and (2) those having a transfer pattern formed by a scattering body, such as a metal thin film, are called a scattering membrane mask (for example, refer to "Journal of Vacuum Science and Technology", B15, P. 2130 (1997) by L. R. Harriott).

The former stencil mask is used for both of the PEL and EPL, while the scattering membrane mask cannot be used for the PEL. It is because the PEL generally uses a low speed EB of several keV or less and the incident EB on the membrane is all absorbed.

Since these masks include a membrane region having low mechanical strength, a mask structure of not configuring the overall mask region with one membrane but configuring with a large number of small sectional membranes divided by a lattice shaped beam has been proposed. For example, a PEL mask is described in the Japanese Unexamined Patent Publication No. 2003-59819 and an EPL mask is described in the U.S. Pat. No. 5,523,580.

FIG. 1 is a schematic perspective view of a mask having a lattice shaped beam as above. The lattice shaped beam 100b composes a plurality of recessed portions 100a and, thereby, a thin film (membrane) 102 is divided to a large number of small sectional membranes. In the thin film 102, small regions sectionalized by the beam 100b respectively become pattern regions PA formed with a pattern.

As a method of producing a mask having the above beam structure, a method of using wet etching by an alkali solution of KOH, etc. and a method of using reactive ion etching are described in the U.S. Pat. No. 6,428,937.

FIG. 2A is a schematic sectional view of the above stencil mask.

It has a multilayer structure of forming on a silicon substrate 110 a buried oxide layer 111 as an interlayer having an etching stopper function and a silicon thin film (SOI: silicon on insulator) 112 to be a membrane. A part of the substrate 110 corresponding to the membrane is formed with recessed portions 110a sectionalized to be a lattice shape by being etched from the back surface to configure the lattice shaped beam 110b.

Also, the SOI layer 112 is formed with through holes P along a mask pattern.

FIG. 2B is a schematic sectional view of the above scattering membrane mask.

A silicon nitride thin film 121 to be a membrane is formed on the silicon substrate 120, and a part of the substrate 120 corresponding to the membrane is formed with recessed portions 120a sectionalized to be a lattice shape by being etched from the back surface to compose the lattice shaped beam 120b.

Also, a scattering body pattern 124, for example, made by a chrome film 122 having a film thickness of 10 nm and a tungsten film 123 having a film thickness of 50 nm is formed along the mask pattern.

As a method of transferring a pattern of a mask used in the PEL and EPL on a wafer at a high accuracy, a method of measuring distortion of the mask and correcting it when transferring can be considered.

This concept itself is not new and has been also used in photolithography, and IP accuracy of a produced photomask is measured routinely by a coordinate measuring device called "LMS IPRO" made by LEICA Corporate or "lightwave XY-6i" made by Nikon Corporation.

For example, when a magnification error of 3 ppm is measured on a mask pattern, the error can be corrected by finely adjusting an optical system of an exposure apparatus when exposing the photomask with a stepper or a scanner.

However, in lithography using charged particles, such as the PEL and EPL, since incident particles can be deflected at high accuracy and high speed by an electrostatic/magnetic field lens, it is considered that correction at a higher accuracy becomes possible.

In the case of the PEL, a main deflection lens and a sub deflection lens are combined to deflect the EB. Here, by scanning the EB by the main deflection lens on the mask region and changing an incident angle of the EB by the sub deflection lens in real time, distortion of the mask can be corrected (for example, refer to the U.S. Pat. No. 4,334,156).

On the other hand, in the case of the EPL, individual membrane sectionalized by the beam 100b as shown in FIG. 1 is defined as a subfield, and a method of transferring the subfield by EB irradiation at one time on a wafer and forming a device pattern by successively connecting the subfields on the wafer is applied. For example, a method of correcting distortion for each subfield is disclosed in the Japanese Unexamined Patent Publication No. 2000-124114.

In the case of the PEL, there is an advantage that, by giving information of distortion over the whole mask region as a map and compensating between measurement data points by a function of a higher order, distortion of a higher order can be corrected in addition to linear distortion of magnification, rotation and orthogonality.

On the other hand, in the case of the EPL, only linear distortion of each subfield can be corrected.

In either case of the above PEL and EPL, accurate measurement of mask distortion is important at first. However, a mark for a coordinate measuring device, such as the above LMS IPRO, generally cannot be arranged on a region arranged with a device pattern.

Accordingly, in the case of a photomask, a mark for coordinate measurement is arranged on a part corresponding to a so called scribe line, that is, a chip periphery region (a margin region when detaching a chip on a wafer by dicing).

FIG. 3 is an example of a layout of arranging the marks for coordinate measurement on the scribe line. Coordinate measurement marks MK are arranged on the scribe line SL for sectionalizing the chip region.

Reliability of distortion data becomes higher when increasing the number of coordinate measurement marks to increase measurement points and, furthermore, uniformly distributing them allover the mask region, however, due to the limit that the coordinate measurement marks can be arranged only on the scribe line, only limited number of coordinate measurement marks could be used as shown in FIG. 3.

In the EPL, as shown in FIG. 1, by utilizing the fact that the mask is originally divided to small sectionalized subfields (typically, about 1 mm square), it has been proposed to arrange coordinate measurement marks on a beam between the subfields (refer to the U.S. Pat. No. 6,040,095).

As explained above, since only linear distortion of subfields is corrected in the EPL, it is sufficient to measure marked coordinates at four corners of each subfield. The marks on the beam are not transferred to the wafer, so that it is possible to increase measurement points and improve accuracy of distortion measurement. The U.S. Pat. No. 6,040,095 discloses a formation method and arrangement method of the marks on the beam.

In the method described in the above U.S. Pat. No. 6,040,095, however, accuracy of measuring distortion is limited, so it is difficult to use the method in device production using the PEL and EPL.

Namely, the method of the U.S. Pat. No. 6,040,095 stands on an assumption that beam marks and an actual device pattern in a membrane displace by the same distortion function, so that disposition of the latter can be corrected based on measurement data of the former. However, this assumption is physically not self-evident, moreover, it became clear that it stood only approximately in our actual measurement.

Accordingly, more accurate measurement of distortion of the membrane is not possible only by measuring the beam marks. Particularly, in the case of the PEL, since a pattern on the mask is transferred on the wafer without reduction, an effect of a distortion data error is supposed to be larger than that in the case of the EPL. Thus, it is difficult to apply the method described in the U.S. Pat. No. 6,040,095 as it is.

SUMMARY OF THE INVENTION

An object of the present invention is to provide a method of generating mask distortion data capable of improving accuracy of measuring distortion, an exposure method for more accurately correcting mask distortion for exposure by using the same, and a method of producing a semiconductor device using the same.

To attain the above object, there is provided a method of generating mask distortion data of a first thin film of a production mask formed with first positional accuracy measurement marks and having at least one first thin film formed with a transmittance portion and a blocking portion of a charged particle beam of a predetermined pattern, comprising steps of obtaining a positional accuracy measurement mask by forming second positional accuracy measurement marks at substantially same positions as those of the first positional accuracy measurement marks on mask blanks having at least one second thin film, and forming third positional accuracy measurement marks on the second thin film; measuring positions of the second positional accuracy measurement marks and the third positional accuracy measurement marks of the positional accuracy measurement mask; calculating a correlation function between positions of the second positional accuracy measurement marks and the third positional accuracy measurement marks of the positional accuracy measurement mask; measuring positions of the first positional accuracy measurement marks of the production mask; and generating mask distortion data on the first thin film of the production mask from positions of the first positional accuracy measurement marks of the production mask by using the correlation function.

The generation method of mask distortion data of the present invention as above is a method of generating mask distortion data of a first thin film of a production mask formed with first positional accuracy measurement marks and having at least one first thin film formed with a transmittance portion and a blocking portion of a charged particle beam of a predetermined pattern.

A positional accuracy measurement mask is obtained by forming second positional accuracy measurement marks at substantially same positions as those of the first positional accuracy measurement marks on mask blanks having at least one second thin film, and forming third positional accuracy measurement marks on the second thin film.

Next, positions of the second positional accuracy measurement marks and the third positional accuracy measurement marks of the positional accuracy measurement mask are measured, and a correlation function between positions of the second positional accuracy measurement marks and the third positional accuracy measurement marks of the positional accuracy measurement masks is calculated.

Next, positions of the first positional accuracy measurement marks of the production mask are measured.

Next, mask distortion data on the first thin film of the production mask is generated from positions of the first positional accuracy measurement marks of the production mask by using the correlation function.

To attain the above object, according to the present invention, there is provided an exposure method for exposing a pattern by using a production mask formed with first positional accuracy measurement marks and having at least one first thin film formed with a transmittance portion and a blocking portion of a charged particle beam of the predetermined pattern, comprising steps of obtaining a positional accuracy measurement mask by forming second positional accuracy measurement marks at substantially same positions as those of the first positional accuracy measurement marks on mask blanks having at least one second thin film, and forming third positional accuracy measurement marks on the second thin film; measuring positions of the second positional accuracy measurement marks and the third positional accuracy measurement marks of the positional accuracy measurement mask; calculating a correlation function between positions of the second positional accuracy measurement marks and the third positional accuracy measurement marks of the positional accuracy measurement mask; measuring positions of the first positional accuracy measurement marks of the production mask; generating mask distortion data on the first thin film of the production mask from positions of the first positional accuracy measurement marks of the production mask by using the correlation function; and exposing the pattern by using the production mask while correcting mask distortion of the first thin film based on the mask distortion data.

In the exposure method of the present invention as above, mask distortion data is generated by the above generation method of mask distortion data of the present invention, then, a pattern is exposed by using the production mask while correcting mask distortion on the first thin film based on the mask distortion data.

To attain the above object, a method of producing a semiconductor device including a step of exposing a pattern on a wafer to be exposed by using a production mask formed with first positional accuracy measurement marks and having at least one first thin film formed with a transmittance portion and a blocking portion of a charged particle beam of the predetermined pattern, comprising steps of obtaining a positional accuracy measurement mask by forming second positional accuracy measurement marks at substantially same positions as those of the first positional accuracy measurement marks on mask blanks having at least one second thin film, and forming third positional accuracy measurement marks on the second thin film; measuring positions of the second positional accuracy measurement marks and the third positional accuracy measurement marks of the positional accuracy measurement mask; calculating a correlation function between positions of the second positional accuracy measurement marks and the third positional accuracy measurement marks of the positional accuracy measurement mask; measuring positions of the first positional accuracy measurement marks of the production mask; generating mask distortion data on the first thin film of the production mask from positions of the first positional accuracy measurement marks of the production mask by using the correlation function; and exposing the pattern on the wafer to be exposed by using the production mask while correcting mask distortion of the first thin film based on the mask distortion data.

The production method of a semiconductor device of the present invention as above includes, after generating mask distortion data by the generation method of mask distortion data of the present invention as above, a step of exposing a pattern on a wafer to be exposed by using the production mask while correcting mask distortion on the first thin film based on the mask distortion data.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, a generation method of mask distortion data according to the present embodiment, an exposure method using the same and a production method of a semiconductor device will be explained with reference to the drawings.

First Embodiment

The present embodiment relates to a method of generating distortion data of a mask, such as a PEL mask, for exposing by using a low energy electron beam proximity projection lithography (LEEPL) transfer apparatus, which is a method of generating mask distortion data according to a pattern formed on a first thin film of a production mask formed with first positional accuracy measurement marks and having at least one layer of first thin film formed with a transmittance portion and blocking portion of a charged particle beam of a predetermined pattern.

Also, the present embodiment relates to a method of exposing a pattern by correcting distortion based on the mask distortion data by using the above mask.

Figure 4:
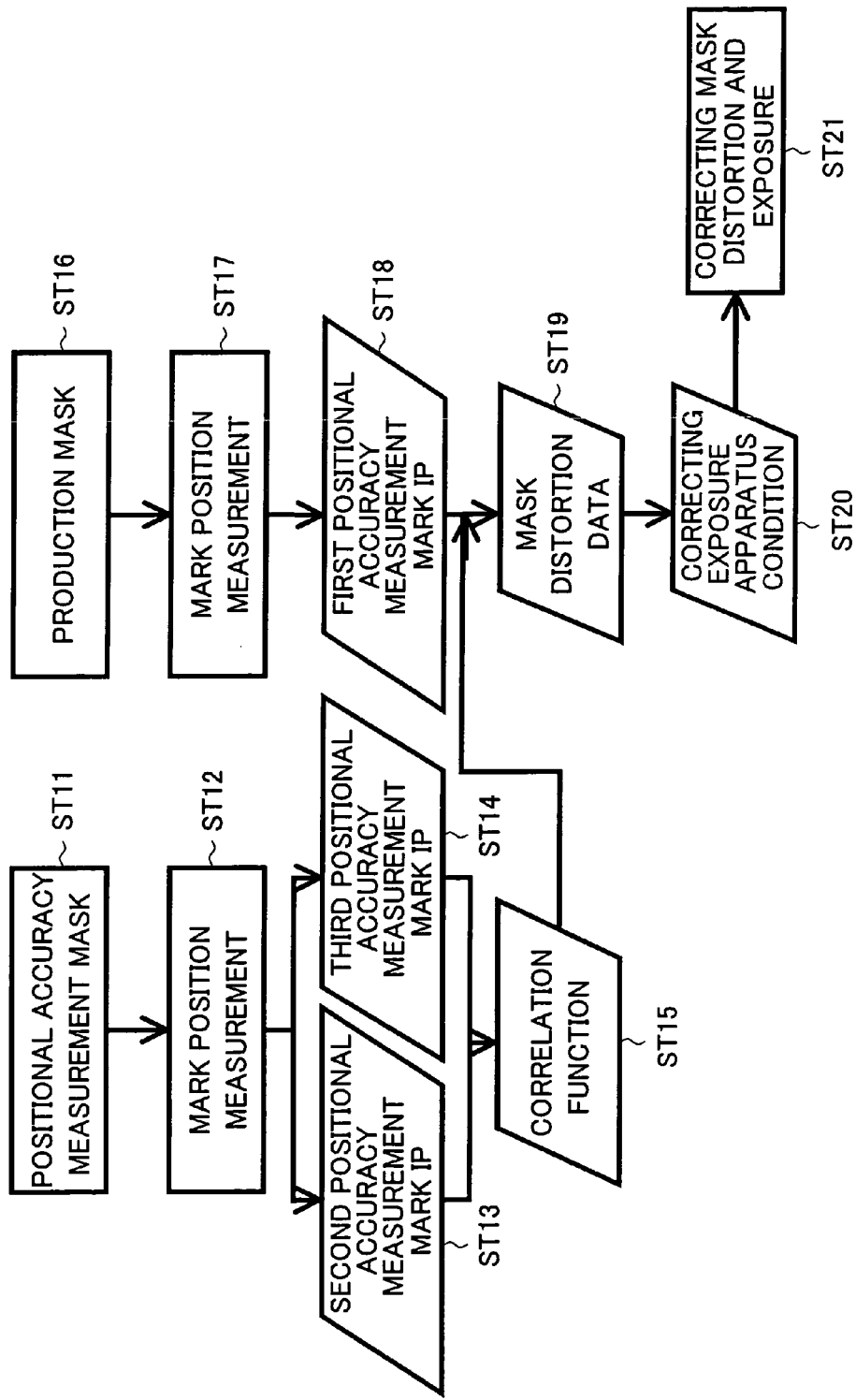
FIG. 4 is a flowchart of a mask distortion data generation method according to a first embodiment and an exposure method using the same.

FIG. 4 is a flowchart of a generation method of mask distortion data according to the present embodiment and an exposure method using the same.

First, as a first step ST11, a positional accuracy measurement mask is formed by mask blanks having at least one layer of second thin film.

Here, it is assumed that except that positional accuracy measurement marks are formed on the second thin film instead of a pattern formed on the first thin film, the configuration of the positional accuracy measurement mask is the same as that of the production mask. Namely, the first thin film and the second thin film have the same layer configuration, and the positional accuracy measurement mask is formed with second positional accuracy measurement marks at substantially the same positions as those of the first positional accuracy measurement marks, and the second thin film is not formed with a pattern but third positional accuracy measurement marks.

Next, in a second step ST12, positions of the second positional accuracy measurement marks and the third positional accuracy measurement marks of the positional accuracy measurement mask are measured by a coordinate measurement device, such as an LMS IPRO. In a third step ST13, IP data of the second positional accuracy measurement marks is obtained. In a fourth step ST14, IP data of the third positional accuracy measurement marks is obtained.

Next, in a fifth step ST15, a correlation function between the IP data of the second positional accuracy measurement marks and the IP data of the third positional accuracy measurement marks is calculated.

Here, the first step ST11 to the fifth step ST15 can be replaced by a finite element simulation modeling the mask.

On the other hand, in a sixth step ST16, a production mask is formed by a mask blanks having at least one layer of a first thin film.

Here, the production mask is formed with first positional accuracy measurement marks as explained above, and a transmittance portion and blocking portion of a charged particle beam of a predetermined pattern are formed on the first thin film.

Next, in a seventh step ST17, in the same way as in the second step ST12, positions of the first positional accuracy measurement marks of the production mask are measured by a coordinate measurement device, such as an LMS IPRO. In an eighth step ST18, IP data of the first positional accuracy measurement marks is obtained.

Next, in a ninth step ST19, by using the correlation function between the IP data of the second positional accuracy measurement marks and the IP data of the third positional accuracy measurement marks obtained in the fifth step ST15, mask distortion data of the first thin film of the production mask is generated from the IP data of the first positional accuracy measurement marks obtained in the seventh step ST17.

From the above, mask distortion data on a pattern formed on the first thin film of the production mask formed with the first positional accuracy measurement marks is generated.

Furthermore, to expose the pattern by using the above production mask, the method below is performed.

Namely, in a tenth step ST20, a condition of an exposure apparatus, such as an EB deflection condition when exposing a pattern by using the production mask, is corrected based on the mask distortion data of the first thin film of the obtained production mask.

Next, in an eleventh step ST21, by using the corrected condition of the exposure apparatus obtained in the tenth step ST20, pattern exposure is performed while correcting the mask distortion.

From the above, a pattern formed on the first thin film of the production mask formed with the first positional accuracy measurement marks is exposed.

Next, the configuration of a production mask and a positional accuracy measurement mask according to the generation method of the mask distortion data according to the present embodiment and the exposure method will be explained.

First, the production mask will be explained.

Figure 5A:
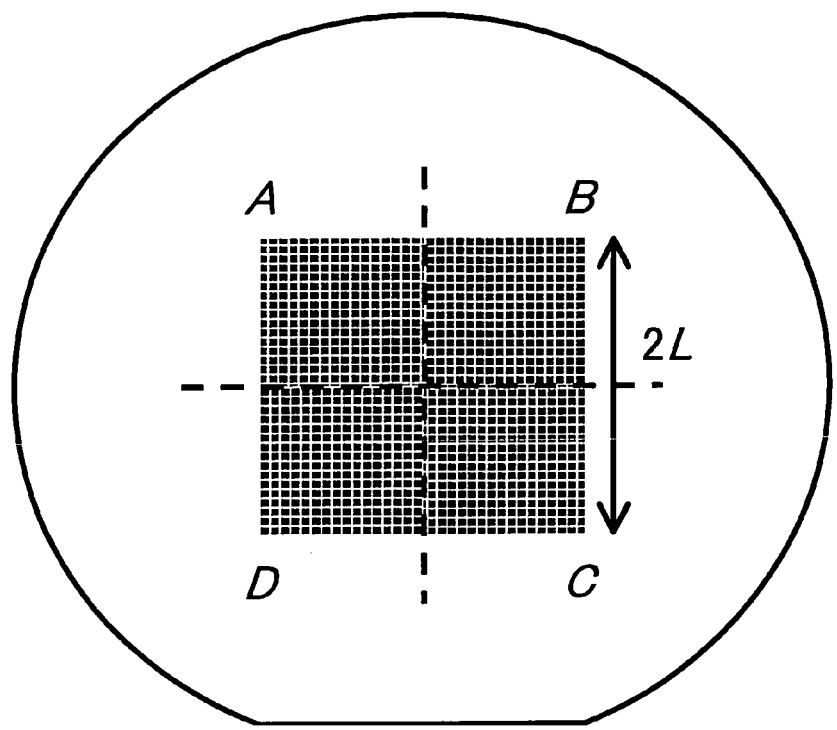
FIG. 5A is a plan view of an appearance of a production mask and a positional accuracy measurement mask according to the first embodiment.

FIG. 5A is a plan view of an appearance of the above production mask.

The production mask has a square mask region having sides of 2 L. The mask region is divided to four squares A to D respectively having sides of L, and each of them becomes one complementary mask.

Figure 5B:
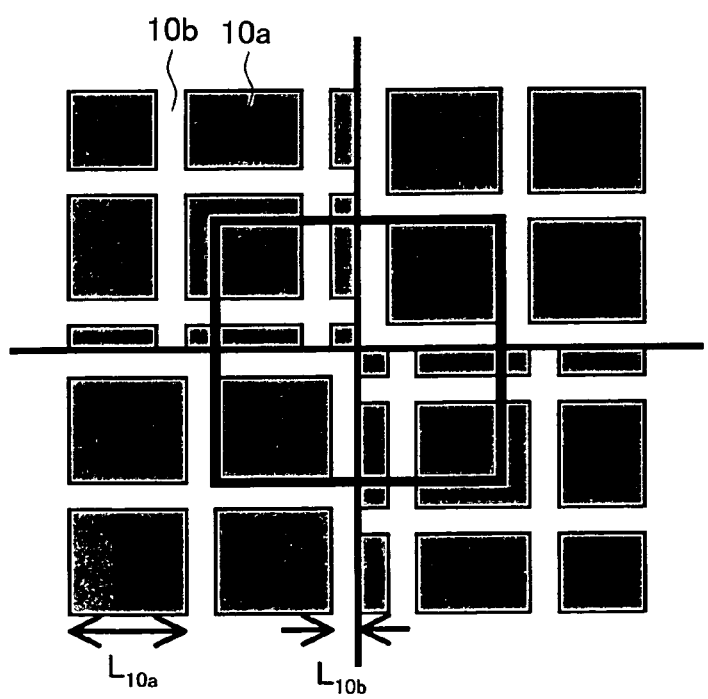
FIG. 5B is an enlarged view of a center portion of the mask region.

FIG. 5B is an enlarged view of a center portion of the mask region of FIG. 5A. A recessed portion 10a to be a small sectionalized membrane region having sides of $L_{10a}$ is divided by a lattice shaped beam 10b having a width of $L_{10b}$. A pattern formed respectively on the small sectionalized membrane regions is omitted.

For example, a side $L_{10a}$ of the recessed portion 10a is 1050 μm, the width $L_{10b}$ of the beam is 200 μm, and a side 2L of the overall mask region is 40 mm.

Figure 6:
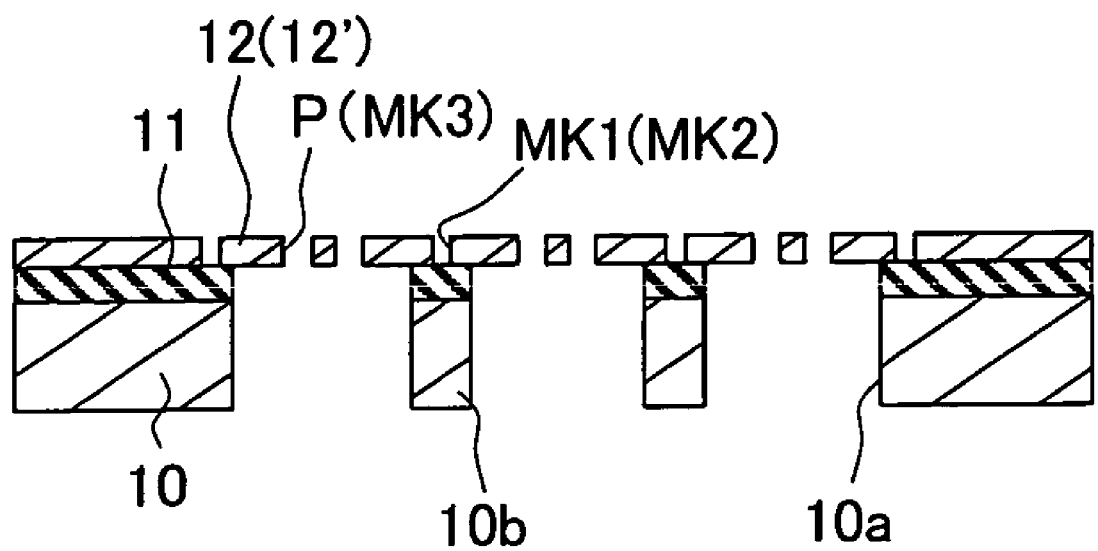
FIG. 6 is a schematic sectional view of the production mask and the positional accuracy measurement mask according to the first embodiment.

Also, FIG. 6 is a schematic sectional view of the above production mask.

It has the multilayer configuration wherein a buried oxide film (BOX) 11 as an interlayer having an etching stopper function and a first silicon thin film (SOI: silicon on insulator) 12 to be a membrane are formed on a silicon substrate 10. A part of the silicon substrate 10 corresponding to the membrane is etched from the back surface to be formed with recessed portion 10a sectionalized to be a lattice shape to configure the lattice shaped beam 10b.

The SOI layer 12 on the region of the recessed portions 10a sectionalized by the lattice shaped beam 10b is formed through holes P along a mask pattern.

Here, on a region of forming the lattice shaped beam 10b for sectionalizing the recessed portions 10a to be small sectionalized membrane regions, first positional accuracy measurement marks MK1 are formed on the SOI layer 10.

Figure 7:
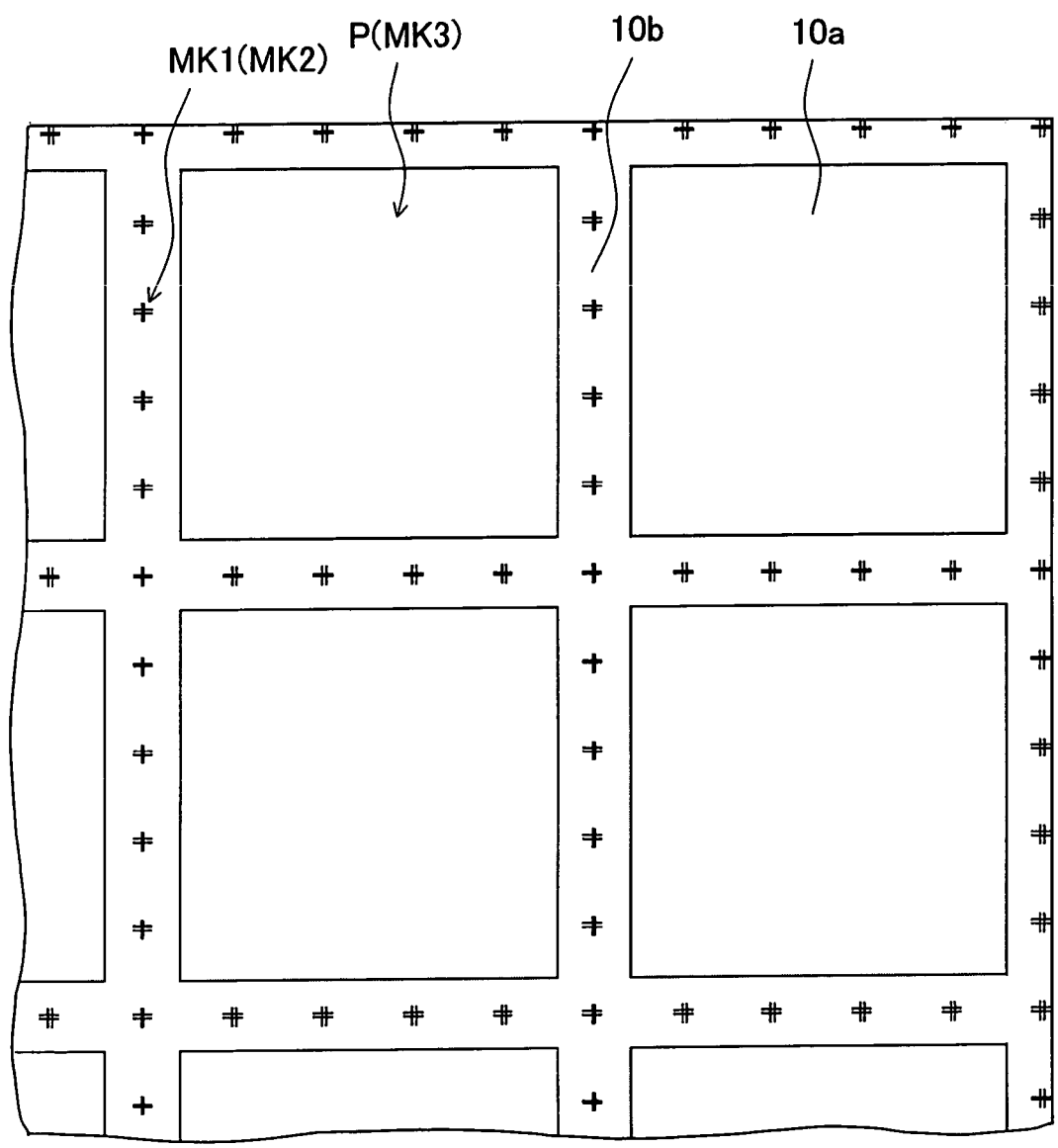
FIG. 7 is a plan view of a layout of the production mask and the positional accuracy measurement mask according to the first embodiment.

Also, FIG. 7 is a plan view of a layout of positional accuracy measurement marks of the above production mask.

The first positional accuracy measurement marks MK1 are formed on a region for forming the lattice shaped beam 10b for sectionalizing the recessed portions 10a to be small sectionalized membrane regions.

Here, the first positional accuracy measurement marks MK1 may be formed on the SOI layer 12 positioned above the beam 10b as shown in FIG. 6 or on the surface of the beam 10b on the opposite surface from the surface to be formed the SOI layer 12 as far as they are on the lattice shaped beam 10b formation region. It can be selected, for example, in accordance with the posture at the time of measuring positions of the first positional accuracy measurement marks MK1.

The through holes P along the mask pattern shown in FIG. 6 are omitted in FIG. 7.

On the other hand, the positional accuracy measurement mask has the same configuration as that of the above production mask, but is different in the point that third positional accuracy measurement marks MK3 are formed instead of through holes along the mask pattern on the SOI layer on the recessed portion 10a.

The positional accuracy measurement mask will be explained with reference to FIG. 6 and FIG. 7.

Namely, a BOX layer 11 and a second thin film (SOI) 12' are stacked on a silicon substrate 10, a part of the silicon substrate corresponding to a membrane is etched from the back surface to form recessed portions 10a sectionalized to be a lattice shape, so a lattice shaped beam 10b is configured.

Here, as shown in FIG. 7, second positional accuracy measurement marks MK2 are formed on the formation region of the lattice shaped beam 10b in the same way as in the first positional accuracy measurement marks MK1.

Also, the SOI layer 12' on the region of the recessed portions 10a sectionalized by the lattice shaped beam 10b is formed third positional accuracy measurement marks MK3. Detailed illustration is omitted in FIG. 7.

Figure 1:
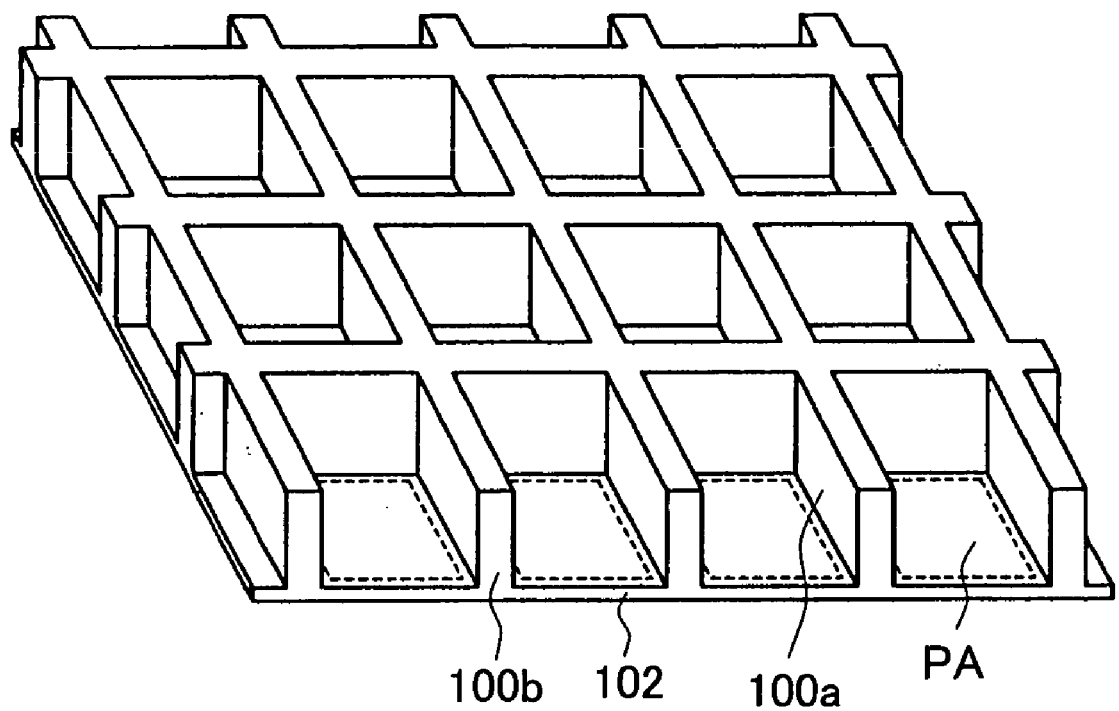
FIG. 1 is a schematic perspective view of a mask having lattice shaped beam according to the related art.
Figure 2A:
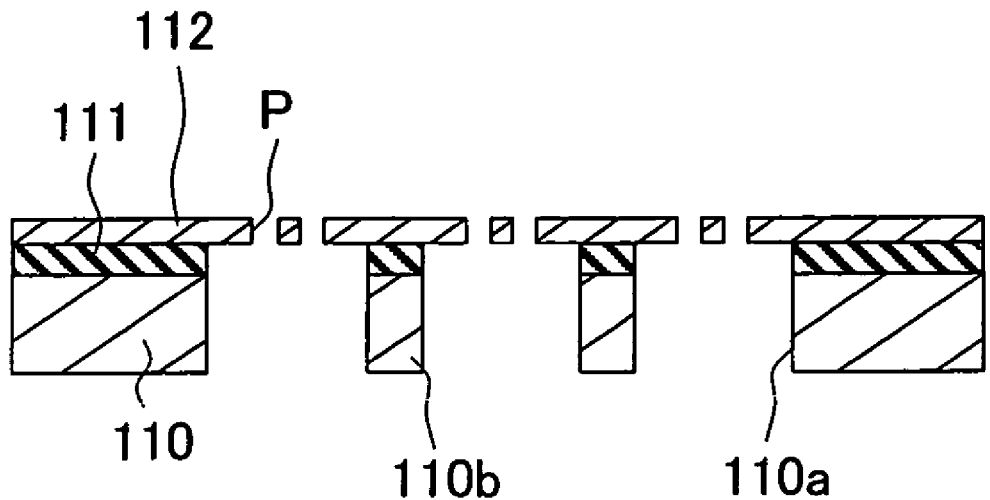
FIG. 2A is a schematic sectional view of a stencil mask according to the related art and FIG. 2B is a schematic sectional view of a scattering membrane mask according to the related art.
Figure 2B:
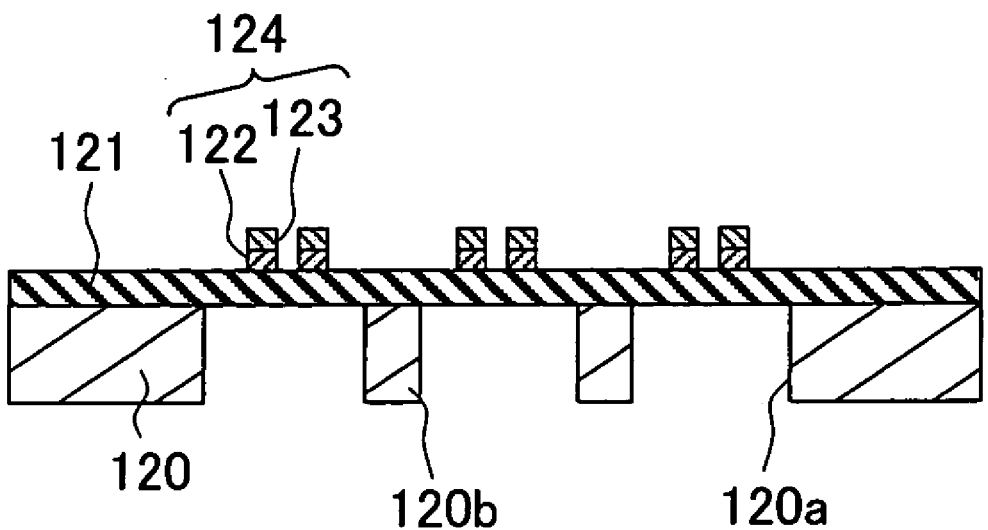
Figure 3:
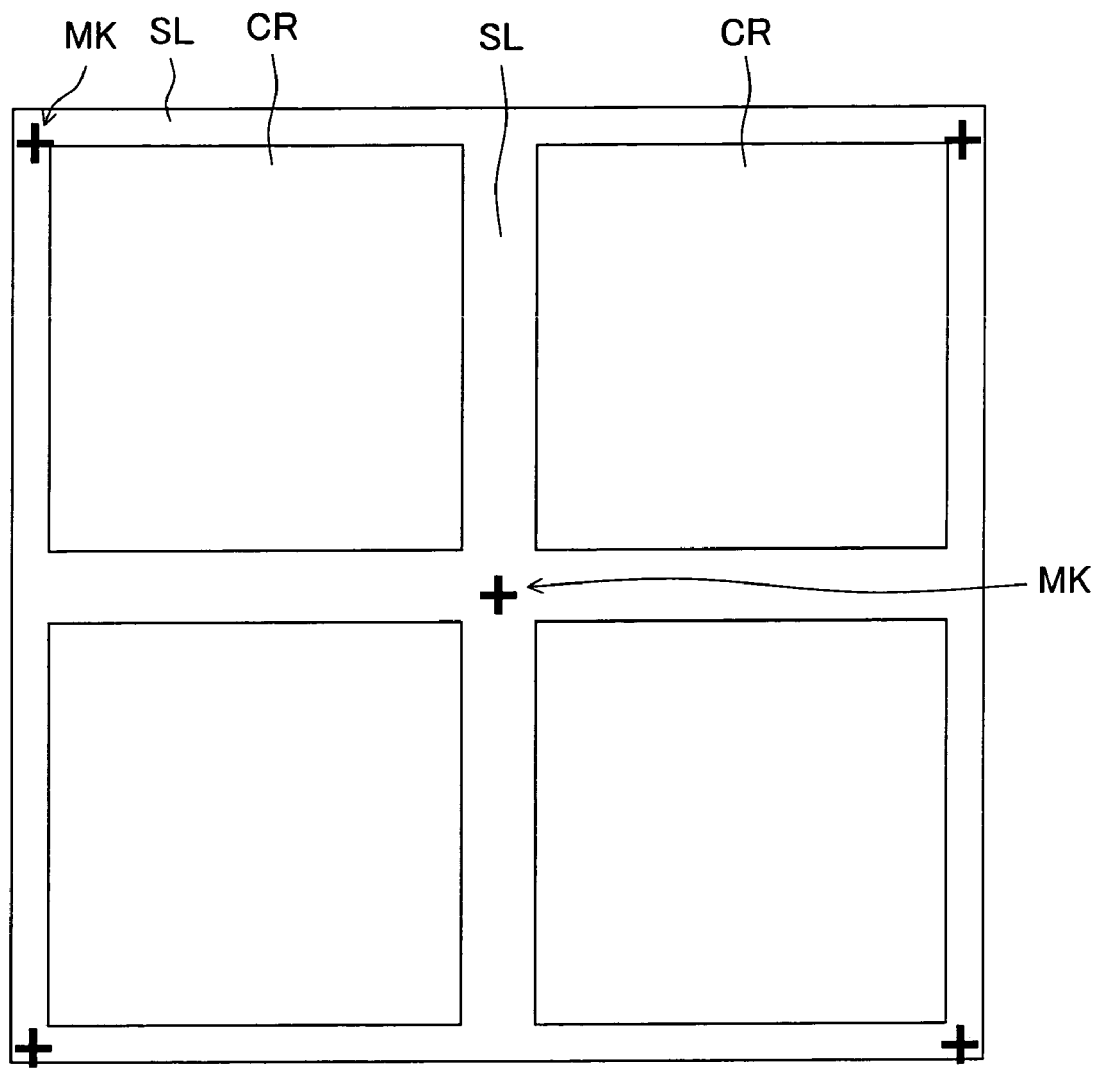
FIG. 3 is an example of a layout of arranging coordinate measurement marks on scribe lines according to the related art.

As the first positional accuracy measurement marks MK1 and the second positional accuracy measurement marks MK2, for example, twenty marks are formed on the formation region of the beam 10b around the region divided as one recessed portion. In this way, much larger number of marks can be arranged than the number of marks in the related art shown in FIG. 3, so that distortion of a higher order can be measured by this and terms of a higher order other than linear components can be corrected.

Also, as the third positional accuracy measurement marks MK3, for example, 3×3 number of square marks by 6 μm by 6 μm are arranged at pitches of 500 μm in each recessed portion 10a sectionalized to be a lattice shape.

Next, a method of producing a production mask and a positional accuracy measurement mask configured as above will be explained. For example, a method described in detail in the Japanese Unexamined Patent Publication No. 2003-59819 and an application (the Japanese Patent Application No. 2001-370600) by the present inventors can be preferably applied.

In a production mask, except that through holes are formed along the mask pattern of the SOI layer on the region of the recessed portions 10a, and the third positional accuracy measurement marks MK3 are formed on the positional accuracy measurement mask, the production mask and the positional accuracy measurement mask can be formed in the same way.

Figure 8A:
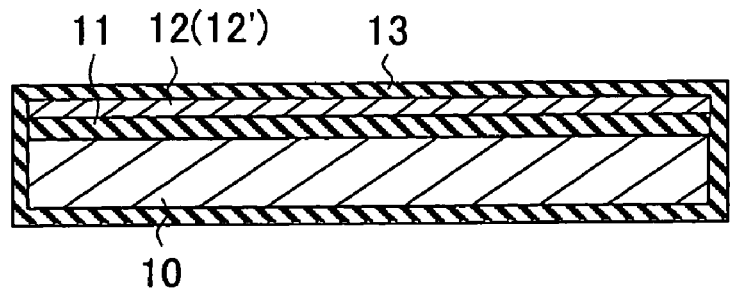
FIG. 8A to FIG. 8C are sectional views of a method of producing the production mask and the positional accuracy measurement mask according to the first embodiment.

First, as shown in FIG. 8A, for example, an SOI wafer formed by stacking a buried oxide film (BOX layer) 11 as an interlayer having an etching stopper function and a silicon layer (SOI layer) 12 to be a membrane on a silicon substrate 10 is prepared. The whole surface of the SOI wafer is covered with a natural oxide film 13.

By injecting boron (B) to the SOI wafer configured as above, an internal stress of the membrane layer is adjusted.

Figure 8B:
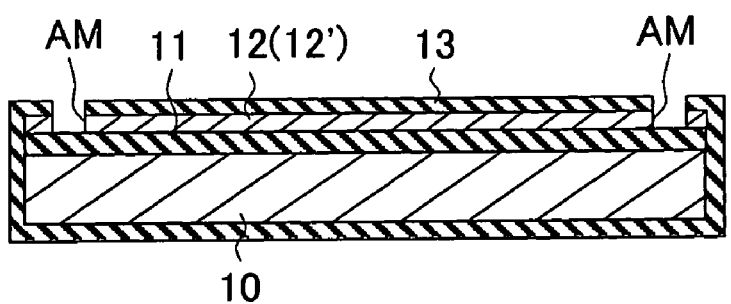

Next, as shown in FIG. 8B, for example, the SOI layer 12 is removed until reaching to the BOX layer 11 to be a predetermined pattern on the periphery portion of the SOI wafer so as to form alignment marks AM.

Figure 8C:
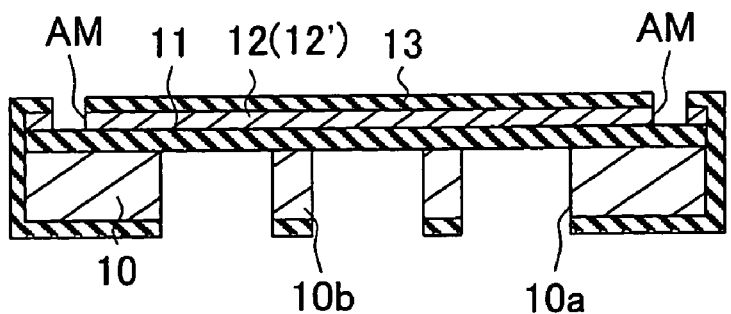

Next, as shown in FIG. 8C, a resist film (not shown) is formed on the back surface of the silicon substrate, openings of a pattern of a lattice shape is formed by exposure and development, etching processing, such as RIE (reactive ion etching), is performed to form a recessed portion 10a reaching to the BOX layer 11 from the back surface of the silicon substrate 10, for example, of a pattern sectionalized to be a lattice shape. At this time, a portion left to be a lattice shape on the silicon substrate 10 becomes the lattice shaped beam 10b, and the silicon substrate 10 becomes a supporting frame on the peripheral portion of the SOI wafer.

Figure 9A:
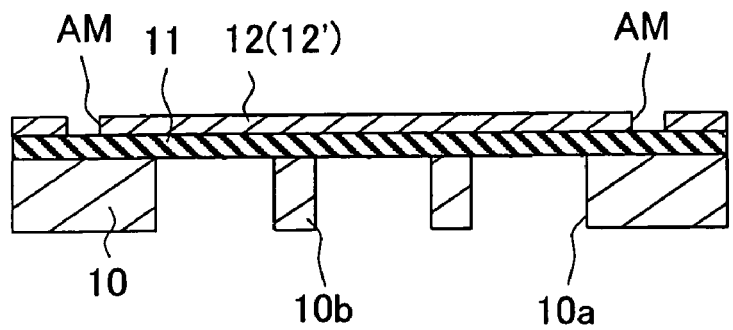
FIG. 9A to FIG. 9C are sectional views of a method of producing the production mask and the positional accuracy measurement mask according to the first embodiment.

Next, as shown in FIG. 9A, a resist film (not shown) is removed by ashing processing, etc. and oxide silicon on a portion exposed on the surface is removed by wet etching by an HF solution. Namely, the natural oxide film 13 and the BOX film 11 exposed on the bottom portion of the recessed portion 10a are removed.

From the above, mask blanks configured by stacking the BOX layer 11 and the SOI layer 12 on the silicon substrate 10 wherein a recessed portion sectionalized to be a lattice shape is formed to an extent the SOI layer exposes from the back side of the silicon substrate 10.

Figure 9B:
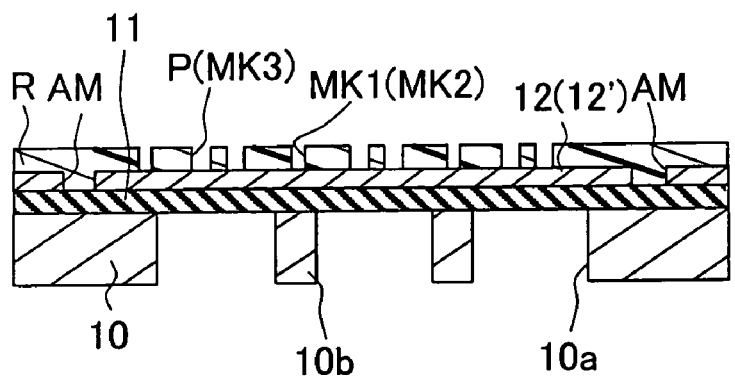

Next, as shown in FIG. 9B, a resist film R is formed on the SOI layer 12, and a pattern P is formed by exposing, for example, by an electron beam and developing along mask data of a mask to be formed in the method of producing the production mask. At the same time, a pattern for the first positional accuracy measurement marks MK1 are also formed on the resist film R.

Next, dry etching, such as RIE, is performed by using the resist film R as a mask, and the pattern P of the mask to be formed on the SOI layer 12 and the first positional accuracy measurement marks MK1 are transferred in the method of producing the production mask.

Figure 9C:
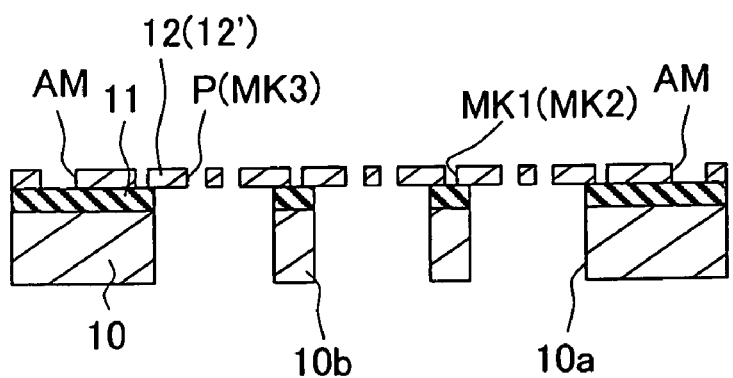

After that, the resist film R is removed by ashing processing, so that a mask having the configuration shown in FIG. 9C can be produced.

On the other hand, in the method of producing a positional accuracy measurement mask, in the same way as in the above production method of the production mask, mask blanks are formed by stacking the BOX layer 11 and the SOI layer 12' on the silicon substrate 10 as shown in FIG. 9A, and a pattern of the second positional accuracy measurement marks MK2 and the third positional accuracy measurement marks MK3 is obtained by exposing and developing along the pattern of the second positional accuracy measurement marks MK2 and the third positional accuracy measurement marks MK3 as shown in FIG. 9B.

Next, as shown in FIG. 9C, a pattern of the second positional accuracy measurement marks MK2 and the third positional accuracy measurement marks MK3 are transferred on the SOI layer 12'.

In the present embodiment, distortion data of a production mask can be generated by a procedure shown in the flow-chart in FIG. 4 by using the production mask and the positional accuracy measurement mask formed as above. Mask distortion data generated as such can improve accuracy of measuring distortion due to the reasons explained later on.

Next, an exposure method capable of performing pattern exposure while more accurately correcting mask distortion when exposing a pattern by using the production mask based on the obtained distortion data of the production mask will be explained.

Figure 10:
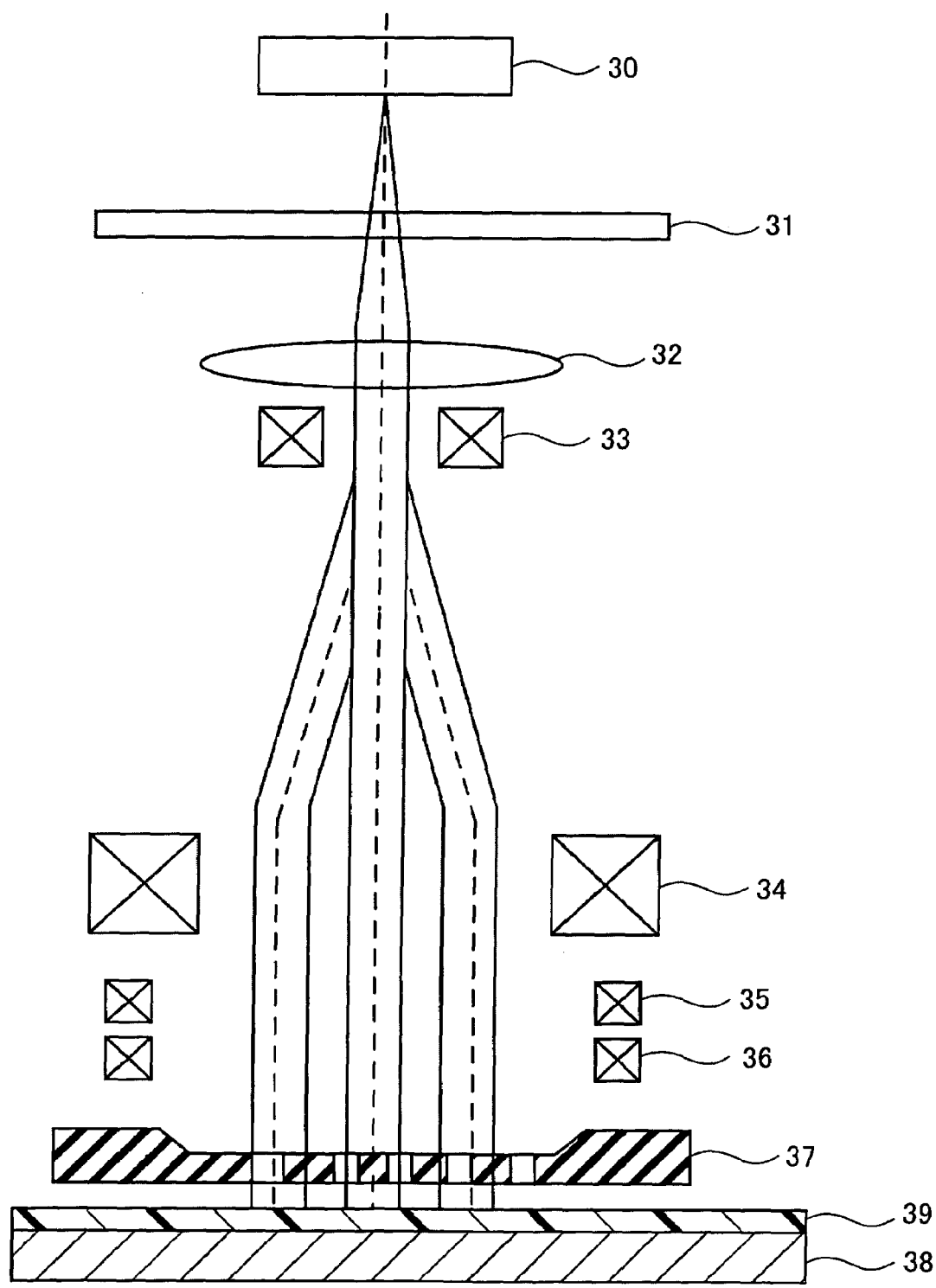
FIG. 10 is a schematic view of an exposure system to be used in the LEEPL.

FIG. 10 is a schematic view of an exposure system used in the LEEPL.

The exposure system comprises an electron gun 30, an aperture 31, a condenser lens 32, a pair of main deflection lenses (33, 34) and a pair of sub deflection lenses (35, 36).

An electron beam EB having a current value of 5.5 μA and a beam diameter of 300 μm accelerated at an EB acceleration voltage of 2 keV emitted from the electron gun 30 is limited by the aperture 31 and made to be a parallel beam by the condenser lens 32.

The main deflection lenses (33, 34) deflect the electron beam, so that the electron beam EB perpendicularly irradiates the stencil mask 37 while being in parallel.

The electron beam EB is incident on the stencil mask 37 in a raster or vector scanning mode, and the main deflection lenses (33, 34) are used for deflecting the electron beam EB in both cases. The sub deflection lenses (35, 36) further precisely adjust the electron beam EB deflected by the main deflection lenses (33, 34).

The electron beam EB transmitted through the stencil mask 37 is incident on the resist film 39 provided, for example, on a silicon wafer 38 and pattern exposure is performed thereon.

In the present embodiment, based on the obtained distortion data of the production mask, it is possible to perform pattern exposure while more precisely correcting mask distortion by using the production mask, for example, correcting the condition of the sub deflection lenses (35, 36), and exposing under the corrected condition.

EXAMPLES

Here, a generation method of mask distortion data of the present embodiment was applied to a PEL mask for generating mask distortion data.

First, a production mask and a positional accuracy measurement mask were formed as explained below.

As a substrate for producing mask blanks, 4 inches (about 100 mm) of SOI wafer available on market produced by a bonding method was used. A thickness of the wafer substrate was 381 μm (polished on both surfaces to improve flatness of the mask), a thickness of the BOX layer was 400 nm, a thickness of the SOI layer was 600 nm, and internal stress of the membrane layer was adjusted to 10 MPa by injecting boron (B) atoms of $10^{19}$/cm$^3$.

On the SOI wafer configured as above, the production mask and the positional accuracy measurement mask having the configurations shown in FIG. 5 and FIG. 6 were formed by steps shown in FIG. 8A to FIG. 8C and FIG. 9A to FIG. 9C.

Here, first positional accuracy measurement marks MK1 on the production mask and second positional accuracy measurement marks MK2 on the positional accuracy measurement mask were configured the same and formed on a formation region of the beam 10b.

On the other hand, a pattern P of a mask to be formed was transferred on the SOI layer on the region of the recessed portions sectionalized to be a lattice shape on the production mask, and a pattern of third positional accuracy measurement marks were transferred on the positional accuracy measurement mask.

In steps below, the production mask and the positional accuracy measurement mask were adhered to an aluminum frame shown in FIG. 11A and FIG. 11B to be used.

Figures 11A, 11B:
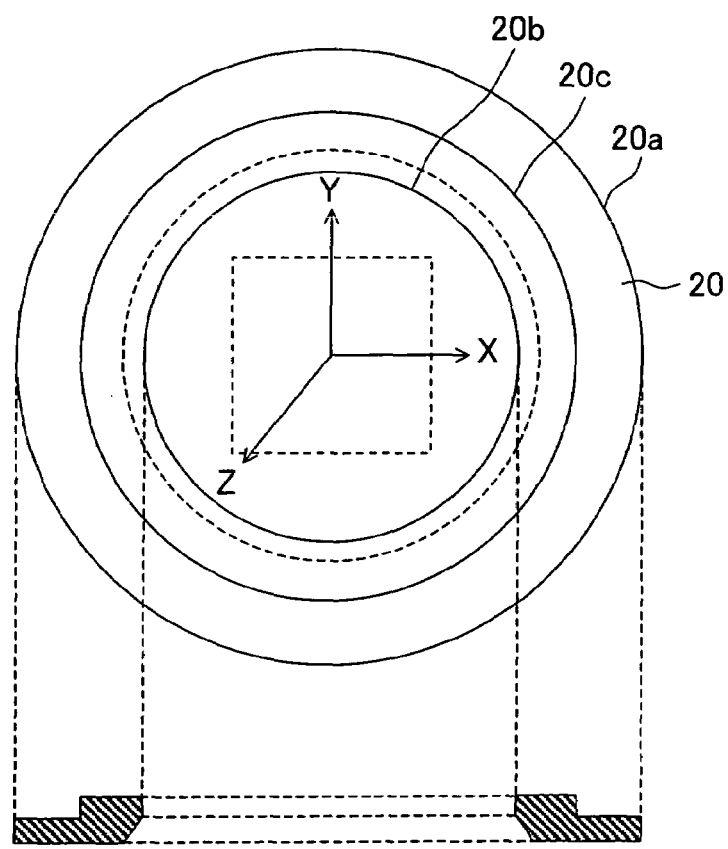
FIG. 11A is a plan view of a frame used in the first embodiment.
FIG. 11B is a sectional view of the same.

FIG. 11A is a plan view of the above frame, and FIG. 11B is a sectional view thereof.

A frame 20 has a ring shape having an outer diameter of 20a and an inner diameter of 20b, and a step 20c is formed at a position of a predetermined diameter. The inner diameter is designed to be wider than the whole mask region having sides of 2 L.

At three points on a circumference on a little inner region of the step 20c being away by 120° from each other, the production mask and the positional accuracy measurement mask were respectively adhered to the above frame with an epoxy resin.

Next, on the positional accuracy measurement mask, positions of the second positional accuracy measurement marks formed on a formation region of a lattice shaped beam and the three positional accuracy measurement marks formed on the SOI layer on the recessed portion formation region sectionalized by the lattice shaped beam were respectively measured by a coordinate measurement device (LMS IPRO), and IP data of the second positional accuracy measurement marks and IP data of the third positional accuracy measurement marks were obtained.

Here, a mask holding cassette was newly produced to measure positional accuracy of the positional accuracy measurement mask and the production mask when measuring positions by the coordinate measurement device.

Figure 12A:
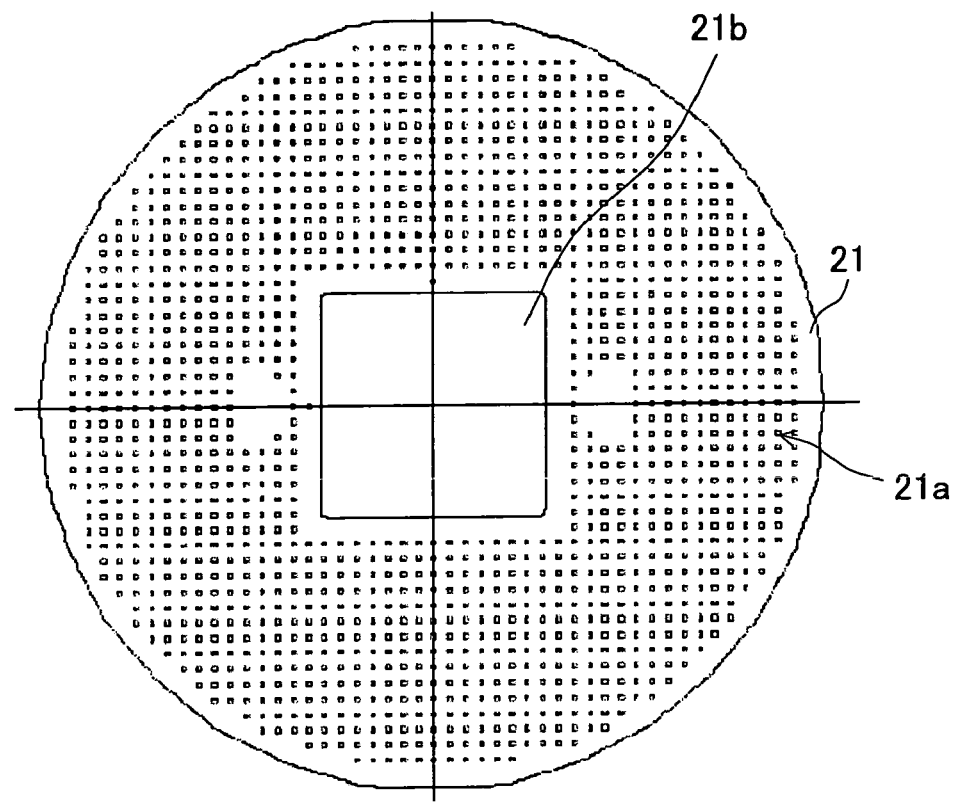
FIG. 12A is a plan view of a mask holding cassette according to the first embodiment.
Figure 12B:
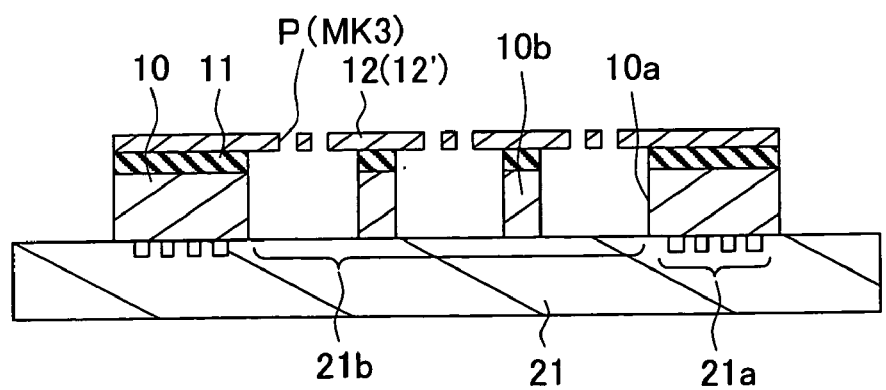
FIG. 12B is a schematic sectional view when holding the mask in the mask holding cassette.

FIG. 12A is a plan view of the mask holding cassette, and FIG. 12B is a schematic sectional view when holding a mask by the mask holding cassette.

The mask holding cassette 21 is provided with an electrostatic chuck 21a and thereby an outer circumference portion other than the mask region 21b (40 mm square at the center in this case) is electrostatically chucked. And measurement is made in a state that the SOI layer (second thin film) 12' faces upward and the mask is held from the opposite side of the SOI layer (second thin film) 12'. Note that in FIG. 12B, illustration of the second positional accuracy measurement marks is omitted.

Also, it may be configured to be provided with a suction chuck instead of the electrostatic chuck.

Consequently, IP accuracy of marks can be measured in a state that the stencil mask is made to be flat.

Here, measurement results of the second positional accuracy measurement marks MK2 formed on the beam formation region and the third positional accuracy measurement marks MK3 formed on the SOI layer on the region of the recessed portions sectionalized to be a lattice shape will be explained.

Figure 13A:
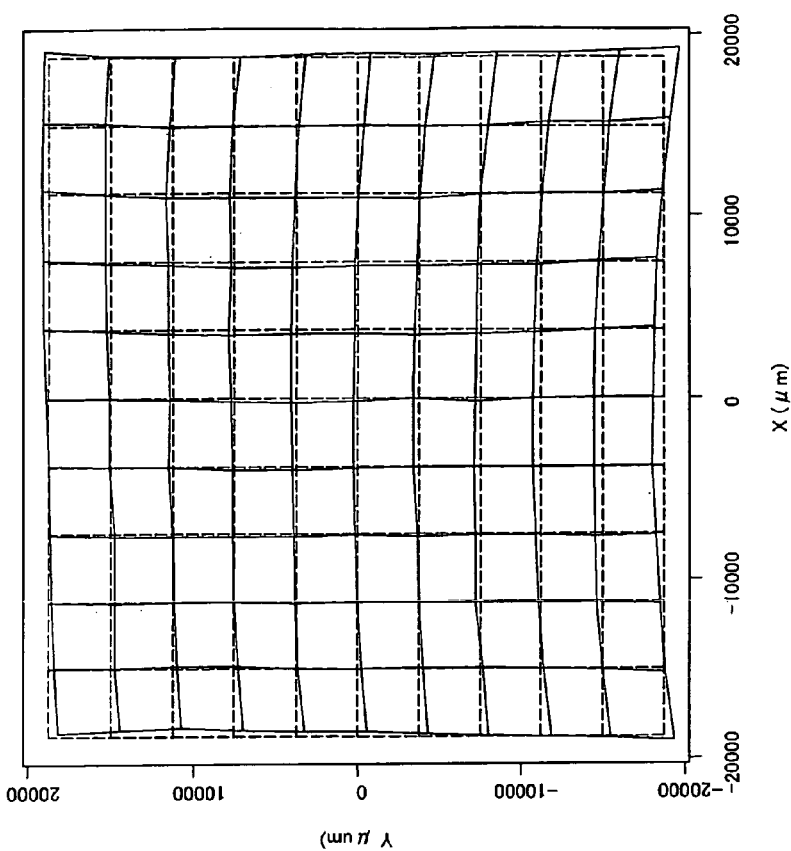
FIG. 13A is a graph of measurement results of second positional accuracy measurement marks formed on a beam formation region.

FIG. 13A is a graph of the measurement result of the second positional accuracy measurement marks MK2 formed on the beam formation region, wherein solid lines are made by connecting actually measured values and broken lines indicate positions of an ideal lattice.

Note that errors are enlarged in the drawings so that deviation from the ideal lattice is easily seen.

Figure 13B:
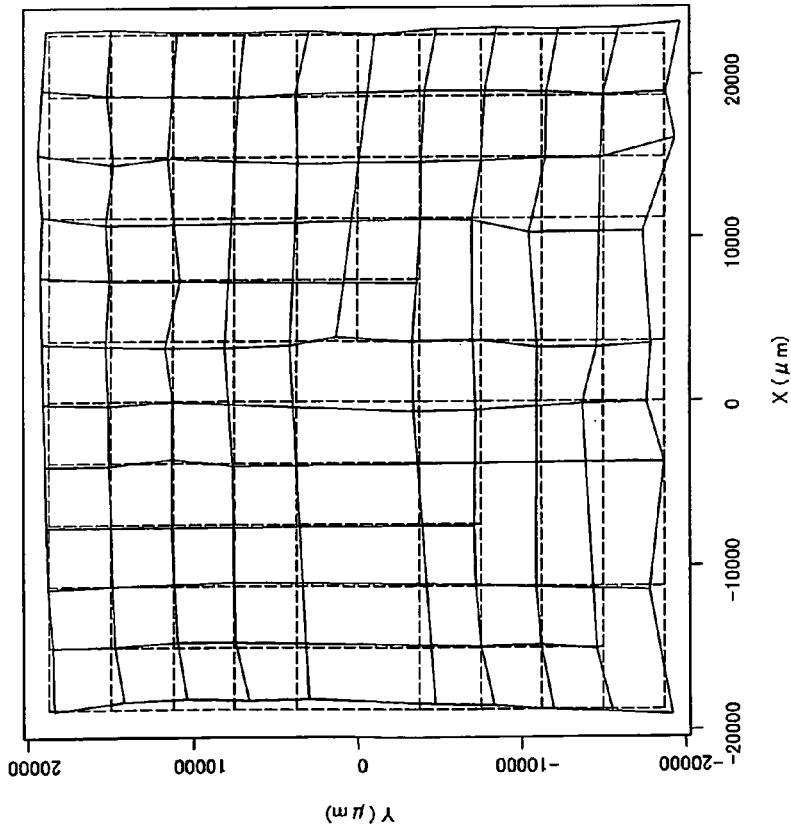
FIG. 13B is a graph of measurement results of third positional accuracy measurement marks formed on an SOI layer on a region of recessed portions sectionalized to be a lattice shape.

On the other hand, FIG. 13B is a graph of measurement results of the third positional accuracy measurement marks MK3 formed on the SOI layer on the region of the recessed portions sectionalized to be a lattice shape, wherein solid lines are made by connecting actually measured values and broken lines indicate positions of an ideal lattice.

As is known from the drawings, IP measurement results of the second positional accuracy measurement marks MK2 formed on the beam formation region and the third positional accuracy measurement marks MK3 formed on the SOI layer on the region of the recessed portions sectionalized to be a lattice shape are similar and seem to qualitatively support an idea of the related art (the U.S. Pat. No. 6,040,095), however, when closely analyzing the data, a difference of about 20 nm at maximum was found between them.

The error is 5 nm in the ¼ reduction projection method, such as the EPL, and 20 nm in the PEL on the wafer. Since an error being unacceptable even in the ¼ reduction production method is generated in the related art, it cannot be used in the PEL as an unmagnification method used in the present embodiment.

What described below is considered as a cause of the error.

When the second positional accuracy measurement marks MK2 formed on the beam formation region and the third positional accuracy measurement marks MK3 formed on the SOI layer on the region of the recessed portions sectionalized to be a lattice shape are formed by the same drawing in processing steps, an IP error thereof is mainly regulated by accuracy of an EB plotting machine, so the both are supposed to be similar.

However, when fixing a mask on stages of the EB plotting machine and the coordinate measurement device, the fixing methods are not completely the same on the two stages, so that a shape of the mask (projections and recesses) of the mask differs in accordance with difference of degrees to straighten warps of the mask.

The second positional accuracy measurement marks MK2 formed on the beam formation region basically indicate displacement within the plane of (tilting angle of mask substrate)×(half of substrate thickness) as described in articles of mechanics of materials (for example, refer to "Theory of Plates and Shells" by S. P. Timoshenko and S. Woinowsky-Krieger).

On the other hand, the third positional accuracy measurement marks MK3 formed on the SOI layer on the region of the recessed portions sectionalized to be a lattice shape follow displacement induced inside the SOI layer when assuming that deformation of the beam around the region of the recessed portions is constraint displacement (boundary condition).

As explained above, the mechanism of displacement is different, so that it is natural that the both are physically different as shown in FIG. 13A and FIG. 13B.

In the present embodiment, a correlation function between the IP data of the second positional accuracy measurement marks and the IP data of the third positional accuracy measurement marks was calculated from the two data shown in FIG. 13A and FIG. 13B.

In the present embodiment, the correlation function was calculated on an experimental basis, but the process can be substituted by highly accurate finite element simulation.

Next, as shown in FIG. 12A and FIG. 12B, in the same way as in the case of the positional accuracy measurement mask, the first positional accuracy measurement marks formed on the formation region of the lattice shaped beam were measured by the coordinate measurement device (LMS IPRO) and IP data thereof was obtained on the production mask. Note that illustration of the first positional accuracy measurement marks are omitted in FIG. 12B.

Here, at the time of measuring the production mask, the production mask was held by using the same cassette used in measuring the positional accuracy measurement mask.

The measurement results of the first positional accuracy measurement marks MK1 formed on the beam formation region on the production mask will be explained.

Figure 14:
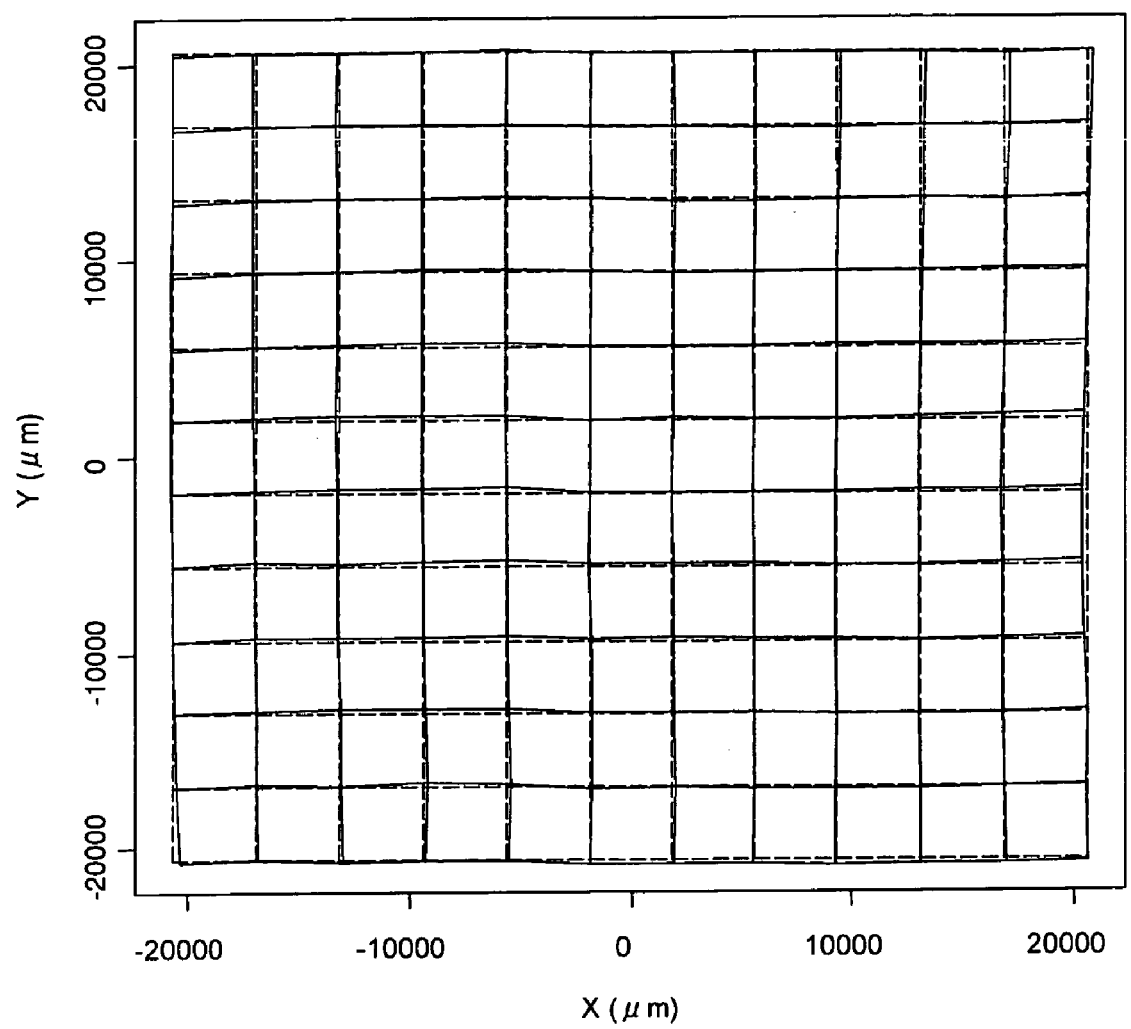
FIG. 14 is a graph of measurement results of first positional accuracy measurement marks formed on the beam formation region.

FIG. 14 is a graph of measurement results of the first positional accuracy measurement marks MK1 formed on the beam formation region, wherein solid lines are made by connecting actually measured values, broken lines indicate positions of an ideal lattice, and errors are enlarged in the same way as the above so that deviation from the ideal lattice is easily seen.

After obtaining the IP data of the first positional accuracy measurement marks as explained above, a correlation function between the IP data of the second positional accuracy measurement marks and the IP data of the third positional accuracy measurement marks obtained as explained above were used to generate mask distortion data on the SOI layer of the production mask.

Next, by using the obtained mask distortion data on the SOI layer of the production mask, sub deflection correction data of the LEEPL transfer apparatus was created.

When transferring a pattern by the PEL on the base circuit pattern formed by ArF lithography based on the obtained sub deflection correction data, superimposing accuracy was remarkably improved from 50 nm (3σ) to 28 nm at the average. It was proved that the generation method of mask distortion data according to the present embodiment and exposure method using the same are extremely effective to improve transfer IP accuracy.

As explained above, in the present embodiment, a correlation function of a distortion function obtained form the second positional accuracy measurement marks MK2 formed on the beam formation region on the positional accuracy measurement mask and the third positional accuracy measurement marks MK3 formed on the SOI layer on the region of the recessed portions sectionalized to be a lattice shape is examined in advance, and an IP error of the first positional accuracy measurement marks MK1 formed on the beam formation region are converted to an IP error of a pattern on the SOI layer of the production mask, and used.

As a result, it is possible to perform pattern exposure while more accurately correcting mask distortion by correcting a condition of an exposure apparatus, such as an EB deflection condition at the time of exposing a pattern by using the production mask, based on the obtained IP error of the pattern.

Second Embodiment

To further improve the correction accuracy of the first embodiment, after generating mask distortion data on the SOI layer (first thin film) of the production mask, it is preferable to correct the mask distortion data by using a function indicating distortion generated on the positional accuracy measurement mask and production mask at the time the second thin film and the first thin film facing upward were made to face downward in both of the positional accuracy measurement mask and the production mask.

High and low positions of the mask becomes inverted between the time of positional accuracy measurement and the time of exposure, and an IP error is generated by global deformation of the mask due to the gravity. Therefore, a pattern image transfer function (ITF) indicating IP shift due to the positional inversion is obtained in advance, and the mask data is shifted based on the function. Note that the detailed description of the method is in the patent application (the Patent Application No. 2002-092612) filed by the present inventors.

The distortion data of the production mask obtained in the first embodiment is data in a state that the SOI layer faces upward. But the SOI layer faces downward in an actual exposure step, so the accuracy is furthermore improved when creating the sub deflection correction data after converting to data in the downward state by the ITF.

Third Embodiment

In the second embodiment, the inversion of the mask posture between the time of IP measurement and the time of exposure of the mask is corrected by the ITF, but there is another method of dealing the mask posture in the IP measurement step same as that in exposure step.

Namely, when measuring positions of the first to third positional accuracy measurement marks (MK1 to MK3) on the positional accuracy measurement mask and the production mask, when being held in the cassette in a state that the first thin film or the second thin film faces downward, positions can be measured by the posture that the first thin film or the second thin film faces downward, which is the same as the posture in the exposure step. Therefore, when measuring positions in this state, more accurate measurement of the positions can be attained without using the ITF and a mask distortion function can be generated.

In a PEL exposure apparatuses and An EPL exposure apparatus, a mask is loaded facing downward, but a face to be electrostatically chucked is different, so that it is preferable to use separately designed cassettes for measuring positions in the same state with the exposure posture as much as possible.

Figure 15:
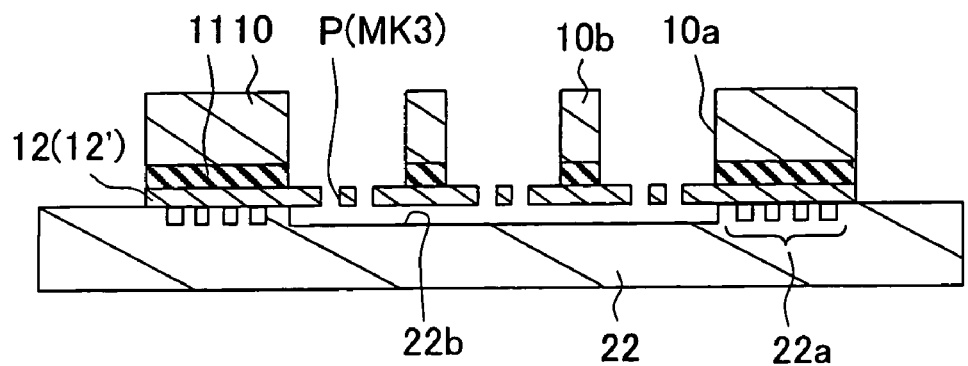
FIG. 15 is a schematic sectional view when holding a mask in a mask holding cassette according to a third embodiment.

FIG. 15 is a schematic sectional view when holding a PEL mask in a mask holding cassette for an EPL mask.

The mask holding cassette 22 is provided with an electrostatic chuck 22a, wherein recessed portions 22b are formed on the mask region and an outer circumferential portion other than the recessed portion is electrostatically chucked.

Here, measurement is made in a state that the SOI layer (12, 12') of the mask faces downward and is supported from the SOI layer (12, 12') side. Note that illustration of the first and second positional accuracy measurement marks are omitted in FIG. 15.

Also, it may be configured to be provided with a suction chuck instead of the electrostatic chuck.

By making IP measurement by reproducing the mask posture and held state in the exposure step, more accurate distortion data can be generated.

Figure 16:
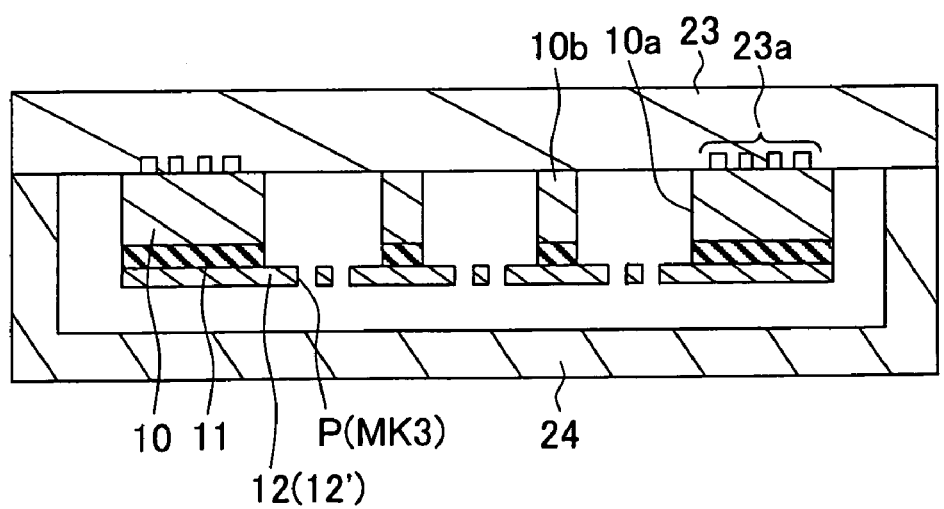
FIG. 16 is a schematic sectional view when holding a mask in the mask holding cassette according to the third embodiment.

FIG. 16 is a schematic sectional view when holding a PEL mask in a mask holding cassette for a PEL mask.

The mask holding cassette is provided with an electrostatic chuck 23a, and an outer circumferential portion other than the mask region 23b is electrostatically chucked thereby. Measurement is made in a state that the SOI layer (12, 12') faces downward and is supported from the opposite side of the SOI layer (12, 12') and inserted in the case 24. Note that illustration of the first and second positional accuracy measurement marks are omitted in FIG. 16.

Also, it may be configured to be provided with a suction chuck instead of the electrostatic chuck.

In the PEL mask, by making IP measurement by reproducing the mask posture and held state in the exposure step, more accurate distortion data can be generated.

According to the generation method of mask distortion data of the present embodiment and the exposure method using the same, effects below can be obtained.

1. In the PEL and EPL, measurement of mask distortion on a production mask can be accurately made by positional accuracy measurement marks formed on a beam formation region which does not interfere with a device pattern.

2. Accuracy of pattern position correction by sub deflection of an electronic optical system is improved as a result that mask distortion can be accurately measured.

3. Due to the improvement of pattern transfer position accuracy, the yield of devices to be produced is improved.

4. Due to the improvement of pattern position correction accuracy, a specification requiring positional accuracy can be reduced, a mask cost is reduced, and a device production cost is reduced.

The above production method of a mask of the present embodiment can be applied to a production method of a semiconductor device.

Namely, distortion data of the production mask is calculated by the generation method of mask distortion data according to the present embodiment.

Next, a correction condition of a sub deflection lens of an EB to correct the obtained distortion data is obtained, pattern exposure is performed by using the production mask, and a pattern formed on the mask is transferred on a photosensitive face.

From the above, a semiconductor device can be produced by applying the production method of a mask of the present embodiment.

The present invention is not limited to the above embodiment.

For example, in the present embodiment, a stencil mask (PEL mask) was explained, but by applying a well known mask production process disclosed in various papers and patents, it can be made to be a mask for NGL. For example, the present invention can be applied not only to the PEL mask, but also to an EPL mask.

Also, the generation method of mask distortion data and the exposure method of the present invention can be applied as a generation method of mask distortion data and an exposure method using the same for performing pattern exposure in a production method of a semiconductor device having a step of performing pattern exposure on a wafer to be exposed.

Other than the above, various modifications can be made within the scope of the present invention.

The method of generating mask distortion data of the present invention is capable of improving accuracy of measuring distortion.

The exposure method of the present invention is capable of performing exposure by more accurately correcting mask distortion by using the generation method of mask distortion data of the present invention.

The method of producing a semiconductor device of the present invention is capable of producing a semiconductor device by using the generation method of mask distortion data of the present invention and the exposure method using the same.

What is claimed is:

1. A method of generating mask distortion data of a first thin film of a production mask formed with first positional accuracy measurement marks and having at least one first thin film formed with a transmittance portion and a blocking portion of a charged particle beam of a predetermined pattern, comprising steps of:

obtaining a positional accuracy measurement mask by forming second positional accuracy measurement marks at substantially same positions as those of said first positional accuracy measurement marks on mask blanks having at least one second thin film, and forming third positional accuracy measurement marks on said second thin film;

measuring positions of said second positional accuracy measurement marks and said third positional accuracy measurement marks of said positional accuracy measurement mask;

calculating a correlation function between positions of said second positional accuracy measurement marks and said third positional accuracy measurement marks of said positional accuracy measurement mask;

measuring positions of said first positional accuracy measurement marks of said production mask; and generating mask distortion data on said first thin film of said production mask from positions of said first positional accuracy measurement marks of said production mask by using said correlation function.

2. A method of generating mask distortion data as set forth in claim 1, wherein:

said production mask and said positional accuracy measurement mask respectively have said thin film and a beam for supporting said thin film to be a lattice shape; and said first positional accuracy measurement marks and said second positional accuracy measurement marks are respectively formed on formation region of said beam.

3. A method of generating mask distortion data as set forth in claim 1, wherein in the step of measuring positions of said second positional accuracy measurement marks and said third positional accuracy measurement marks of said positional accuracy measurement mask and in the step of measuring positions of said first positional accuracy measurement marks of said production mask, measurement is made in a state of holding said positional accuracy measurement mask and said production mask from the opposite side of said second thin film and said first thin film while making said second thin film and said first thin film face upward, respectively.

4. A method of generating mask distortion data as set forth in claim 1, wherein in the step of measuring positions of said second positional accuracy measurement marks and said third positional accuracy measurement marks of said positional accuracy measurement mask and in the step of measuring positions of said first positional accuracy measurement marks of said production mask, measurement is made in a state of holding said positional accuracy measurement mask and said production mask from the side of said second thin film and said first thin film while making said second thin film and said first thin film face downward, respectively.

5. A method of generating mask distortion data as set froth in claim 1, wherein in the step of measuring positions of said second positional accuracy measurement marks and said third positional accuracy measurement marks of said positional accuracy measurement mask and in the step of measuring positions of said first positional accuracy measurement marks of said production mask, measurement is made in a state of holding said positional accuracy measurement mask and said production mask from the opposite side of said second thin film and said first thin film while making said second thin film and said first thin film face downward, respectively.

6. A method of generating mask distortion data as set froth in claim 1, wherein in the step of measuring positions of said second positional accuracy measurement marks and said third positional accuracy measurement marks of said positional accuracy measurement mask and in the step of measuring positions of said first positional accuracy measurement marks of said production mask, measurement is made in a state of holding said positional accuracy measurement mask and said production mask by an electrostatic chuck or a suction chuck, respectively.

7. A method of generating mask distortion data as set froth in claim 3, furthermore comprising a step of correcting said mask distortion data by using a function indicating distortion generated on said positional accuracy measurement mask and said production mask when turning said second thin film and said first film to face downward from the state of facing upward after the step of generating said mask distortion data on said first thin film of said production mask.

8. A method of generating mask distortion data as set froth in claim 1, wherein a transmittance portion of said charged particle beam is a through hole portion formed on said first thin film.

9. An exposure method for exposing a pattern by using a production mask formed with first positional accuracy measurement marks and having at least one first thin film formed with a transmittance portion and a blocking portion of a charged particle beam of said predetermined pattern, comprising steps of:

obtaining a positional accuracy measurement mask by forming second positional accuracy measurement marks at substantially same positions as those of said first positional accuracy measurement marks on mask blanks having at least one second thin film, and forming third positional accuracy measurement marks on said second thin film;

measuring positions of said second positional accuracy measurement marks and said third positional accuracy measurement marks of said positional accuracy measurement mask;

calculating a correlation function between positions of said second positional accuracy measurement marks and said third positional accuracy measurement marks of said positional accuracy measurement mask;

measuring positions of said first positional accuracy measurement marks of said production mask;

generating mask distortion data on said first thin film of said production mask from positions of said first positional accuracy measurement marks of said production mask by using said correlation function; and exposing said pattern by using said production mask while correcting mask distortion of said first thin film based on said mask distortion data.

10. A method of producing a semiconductor device including a step of exposing a pattern on a wafer to be exposed by using a production mask formed with first positional accuracy measurement marks and having at least one first thin film formed with a transmittance portion and a blocking portion of a charged particle beam of said predetermined pattern, comprising steps of:

obtaining a positional accuracy measurement mask by forming second positional accuracy measurement marks at substantially same positions as those of said first positional accuracy measurement marks on mask blanks having at least one second thin film, and forming third positional accuracy measurement marks on said second thin film;

measuring positions of said second positional accuracy measurement marks and said third positional accuracy measurement marks of said positional accuracy measurement mask;

calculating a correlation function between positions of said second positional accuracy measurement marks and said third positional accuracy measurement marks of said positional accuracy measurement mask;

measuring positions of said first positional accuracy measurement marks of said production mask;

generating mask distortion data on said first thin film of said production mask from positions of said first positional accuracy measurement marks of said production mask by using said correlation function; and exposing said pattern on the wafer to be exposed by using said production mask while correcting mask distortion of said first thin film based on said mask distortion data.

* * * * *